(12) United States Patent
Park

(10) Patent No.: US 8,654,558 B2
(45) Date of Patent: *Feb. 18, 2014

(54) MEMORY SYSTEM HAVING IMPROVED SIGNAL INTEGRITY

(71) Applicant: Samsung Electronics Co., Ltd, Suwon-si (KR)

(72) Inventor: Kwang-soo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/762,817

(22) Filed: Feb. 8, 2013

(65) Prior Publication Data

US 2013/0148403 A1   Jun. 13, 2013

Related U.S. Application Data

(63) Continuation of application No. 12/849,133, filed on Aug. 3, 2010, now Pat. No. 8,395,921.

(30) Foreign Application Priority Data

Aug. 7, 2009   (KR) .................. 10-2009-0072827

(51) Int. Cl.
  *G11C 5/06*  (2006.01)
(52) U.S. Cl.
  USPC .............................................. 365/63; 365/51

(58) Field of Classification Search
  USPC ....................................................... 365/63, 51
  See application file for complete search history.

(56) References Cited

U.S. PATENT DOCUMENTS

| | | | | |
|---|---|---|---|---|
| 5,995,430 A | * | 11/1999 | Yabe | 365/203 |
| 7,283,419 B2 | * | 10/2007 | Funfrock et al. | 365/230.03 |
| 7,574,637 B2 | * | 8/2009 | Ricchetti et al. | 365/201 |
| 8,189,407 B2 | * | 5/2012 | Strasser et al. | 365/189.09 |
| 8,395,921 B2 | * | 3/2013 | Park | 365/63 |
| 2008/0126682 A1 | | 5/2008 | Zhao et al. | |

FOREIGN PATENT DOCUMENTS

KR   100765786   10/2007
KR   20080017982   2/2008

* cited by examiner

*Primary Examiner* — Tuan T. Nguyen
(74) *Attorney, Agent, or Firm* — Stanzione & Kim, LLP

(57) ABSTRACT

A memory system having improved signal integrity includes a printed circuit board for use in a memory device, N memory semiconductor packages mounted on the printed circuit board, a first switch mounted on the printed circuit board, a controller mounted on the printed circuit board, N first signal lines connecting the semiconductor packages to the first switch such that the semiconductor packages and the first switch are in an N-to-1 correspondence, a second signal line connecting the first switch to the controller, and N selection lines connecting the semiconductor packages to the first switch such that the semiconductor packages and the first switch are in an N-to-1 correspondence. The N selection lines connect the semiconductor packages to the controller and transmit an enable signal. N is a natural number.

18 Claims, 11 Drawing Sheets

MEMORY SYSTEM HAVING IMPROVED SIGNAL INTEGRITY

CROSS-REFERENCE TO RELATED APPLICATIONS

This is a Continuation Application of U.S. patent application Ser. No. 12/849,133 filed on Aug. 3, 2010 which claims priority under 35 U.S.C. §119 of Korean Patent Application No. 10-2009-0072827, filed on Aug. 7, 2009, in the Korean Intellectual Property Office, the disclosure of which is incorporated herein in its entirety by reference.

BACKGROUND

1. Field of the Invention

The present general inventive concept relates to a memory system, and more particularly, to a memory system having increased storage capacity in a high-speed operating environment.

2. Description of the Related Art

In general, electronic products, such as memory devices, require high-speed data processing. Thus, various methods have recently been introduced to increase operating speeds. In particular, a maximum operating speed of NAND flash memory for use in storage devices, such as solid state drives (SSDs), may be up to 40 Mbps. Also, research is being conducted into development of NAND flash memory that can operate with a maximum data throughput of 133 Mbps.

However, not only an operating speed but also the total number of memory chips to be connected to the same signal line, i.e., the same channel, is a very important factor in NAND flash memory for use in storage devices, such as SSDs. This is because the more memory chips are connected to the same signal line, the greater the storage capacity of NAND flash memory.

However, in a conventional signal line topology, if an operating speed and the total number of memory chips that are to be connected to the same signal line are both increased, then signal integrity may be degraded due to loading effects between a driver and a receiver. That is, input capacitance increases when a frequency is increased in order to increase an operating speed, and load on the system increases when the total number of memory chips that are to be connected to the same signal line is increased, thereby causing a resistance-capacitance (RC) delay to occur.

SUMMARY

The present general inventive concept provides a memory system and a memory device, in which an operating speed and the total number of chips that are to be connected to the same signal line can be increased at the same time.

Additional aspects and utilities of the present general inventive concept will be set forth in part in the description which follows and, in part, will be obvious from the description, or may be learned by practice of the general inventive concept.

Features and/or utilities of the present general inventive concept may be realized by a memory system including a printed circuit board, N memory semiconductor packages mounted on the printed circuit board, a first switch mounted on the printed circuit board, a controller mounted on the printed circuit board, N first signal lines connecting the semiconductor packages to the first switch such that the semiconductor packages and the first switch are in an N-to-1 correspondence, a second signal line connecting the first switch to the controller, and N selection lines connecting the semiconductor packages to the first switch such that the semiconductor packages and the first switch are in an N-to-1 correspondence. The N selection lines may also connect the semiconductor packages to the controller such that semiconductor packages and the controller are in an N-to-1 correspondence, and may transmit an enable signal, wherein N is a natural number.

The first switch may include an N-to-1 multiplexer receiving the enable signal and electrically connecting one of the first signal lines to the second signal line.

The memory system may further include N bi-directional buffers connecting the first signal lines to the first switch such that the first signal lines and the first switch are in an N-to-1 correspondence.

Each of the N bi-directional buffers may include a first repeater having an input terminal connected to the first switch and an output terminal connected to one of the first signal lines, and a second repeater having an input terminal connected to the same first signal line and an output terminal connected to the first switch.

The memory device in which the printed circuit board is to be used may include a solid state drive (SSD), a memory module, a memory card, a memory semiconductor package, or a combination thereof.

Features and/or utilities of the present general inventive concept may also be realized by a memory system including a printed circuit board, N memory semiconductor packages mounted on the printed circuit board, N second switches mounted on the printed circuit board, a controller mounted on the printed circuit board, N first signal lines connecting the semiconductor packages to the second switches, respectively, such that the semiconductor packages and the second switches are in a 1-to-1 correspondence, a second signal line connecting the second switches to the controller, and N selection lines connecting the semiconductor packages to the second switches, respectively, such that the semiconductor packages and the second switches are in a 1-to-1 correspondence. The N selection lines may also connect the semiconductor packages to the controller such that semiconductor packages and the controller are in an N-to-1 correspondence, and transmit an enable signal, wherein N is a natural number.

One of the second switches may receive the enable signal and electrically connect one of the first signal lines to the second signal line.

The memory system may further include N bi-directional buffers connecting the second switches to the second signal line such that the second switches and the second signal line are in an N-to-1 correspondence.

The memory system may further include N bi-directional buffers connecting the first signal lines to the second switches, respectively, such that the first signal lines and the second switches are in a 1-to-1 correspondence.

The memory device in which the printed circuit board is to be used may include a solid state drive (SSD), a memory module, a memory card, a memory semiconductor package, or a combination thereof.

Features and/or utilities of the present general inventive concept may also be realized by a memory device including a memory system, a host interface, and a buffer. The memory system includes a printed circuit board for use in a memory device, N memory semiconductor packages mounted on the printed circuit board, a first switch mounted on the printed circuit board, a controller mounted on the printed circuit board, N first signal lines connecting the semiconductor packages to the first switch such that the semiconductor packages and the first switch are in an N-to-1 correspondence, a second signal line connecting the first switch to the controller, and N selection lines connecting the semiconductor packages to the first switch such that the semiconductor packages and the first switch are in an N-to-1 correspondence. The N selection lines may also connect the semiconductor packages to the controller such that semiconductor packages and the controller are in an N-to-1 correspondence, and transmit an enable signal. The host interface may be disposed on the printed circuit board and may be connected to the controller. The buffer may connect the host interface to the memory system. N may be a natural number.

Features and/or utilities of the present general inventive concept may also be realized by a memory device including a memory system, a host interface, and a buffer. The memory system may include a printed circuit board for use in a memory device, N memory semiconductor packages mounted on the printed circuit board, N second switches mounted on the printed circuit board, a controller mounted on the printed circuit board, N first signal lines connecting the semiconductor packages to the second switches, respectively, such that the semiconductor packages and the second switches are in a 1-to-1 correspondence, a second signal line connecting the second switches to the controller, and N selection lines connecting the semiconductor packages to the second switches, respectively, such that the semiconductor packages and the second switches are in a 1-to-1 correspondence. The N selection lines may also connect the semiconductor packages to the controller such that semiconductor packages and the controller are in an N-to-1 correspondence, and transmit an enable signal. The host interface may be disposed on the printed circuit board and may be connected to the controller. The buffer may connect the host interface to the memory system. N may be a natural number.

Features and/or utilities of the present general inventive concept may also be realized by a memory device including at least two semiconductor packages, a switch connected to each of the semiconductor packages via at least two first I/O lines, each first I/O line connected to a separate semiconductor package, and a controller connected to the switch via a single second I/O line and to each of the switch and the at least two semiconductor packages via an enable line. The controller may control the switch to transmit data between only one of the first I/O lines and the second I/O line.

The at least two semiconductor packages comprise memory semiconductor chips.

At least one of the semiconductor packages may include a logic semiconductor chip.

The switch may include at least two switches, each switch connected to a single semiconductor package and each semiconductor package connected to only one switch, the enable line may include at least two enable lines, and each semiconductor package and corresponding switch may be connected to a same enable line that is separate from an enable line connected to any other semiconductor chip.

Alternatively, the switch may include only one chip.

The memory device may include bi-directional buffers connected between the semiconductor packages and the switch.

The memory device may include bi-directional buffers connected between the switch and the controller package.

Features and/or utilities of the present general inventive concept may also be realized by a memory device including at least two semiconductor packages, a switch connected to each of the semiconductor packages via at least two first I/O lines, each first I/O line connected to a separate semiconductor package of the two semiconductor packages, and a controller connected to the switch via an enable line and to the at least two semiconductor packages via at least one control line. The controller may control the switch to transmit data between only one of the first I/O lines and the second I/O line.

The control line may include at least one of a read/write control line, an address line, and a chip enable line.

At least one of the semiconductor packages may be a logic circuit including at least one terminal to receive a data input from a device external to the memory device.

The second I/O line may be connected to at least one of a logic circuit, a memory chip, a processor, and an I/O port.

Features and/or utilities of the present general inventive concept may also be realized by a computing system including a CPU and a memory device. The memory device may include at least two semiconductor packages, a switch connected to each of the semiconductor packages via at least two first I/O lines, each first I/O line connected to a separate semiconductor package of the two semiconductor packages, and a controller connected to the switch via an enable line and to the at least two semiconductor packages via at least one control line. The CPU may control the controller to transmit data two and from the at least two semiconductor packages.

BRIEF DESCRIPTION OF THE DRAWINGS

Exemplary embodiments of the present general inventive concept will be more clearly understood from the following detailed description taken in conjunction with the accompanying drawings in which.

The above and/or other aspects of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1A:
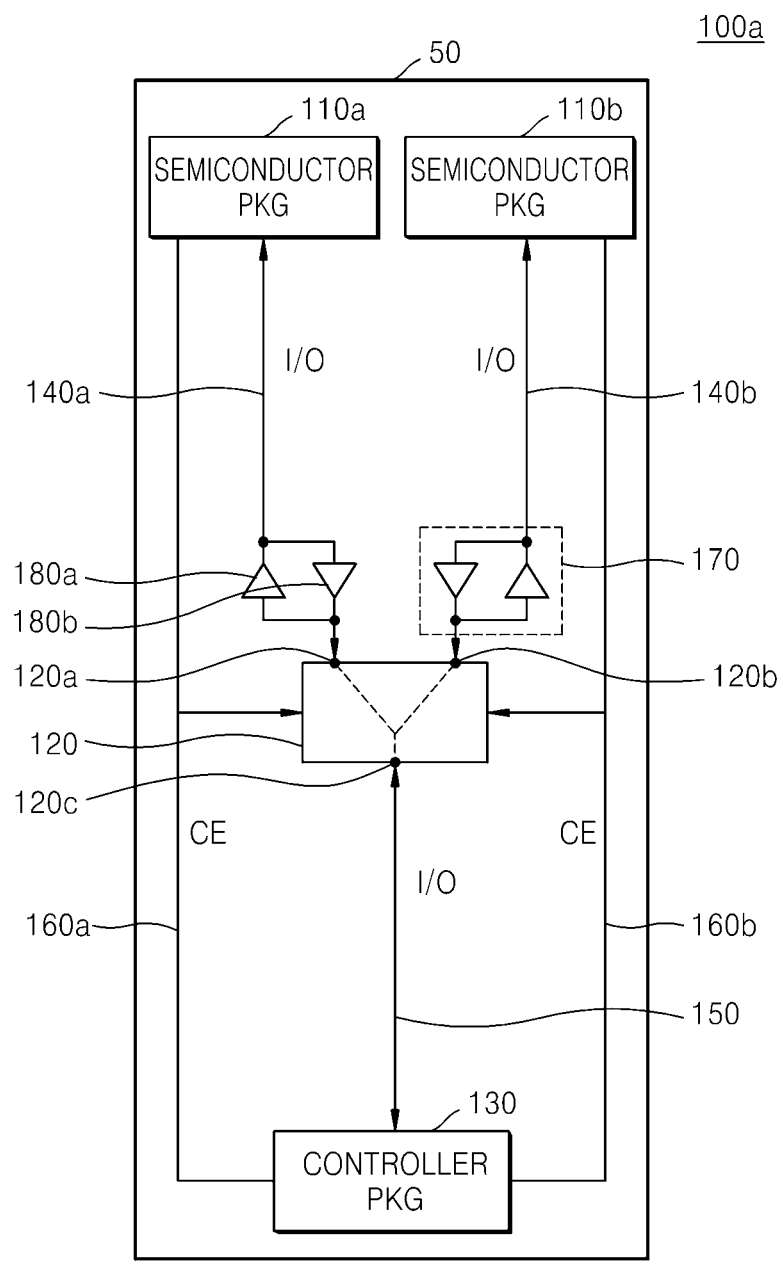
FIGS. 1A-1E are schematic diagrams of a memory system according to embodiments of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

The terminology used herein is for the purpose of describing particular embodiments only and is not intended to limiting of the present general inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

These embodiments of the present general inventive concept are described herein with reference to cross-section illustrations that are schematic illustrations of idealized embodiments (and intermediate structures) of the present general inventive concept. As such, variations from the shapes of the illustrations as a result, for example, of manufacturing techniques and/or tolerances, are to be expected. Thus, embodiments of the present general inventive concept should not be construed as limited to the particular shapes of regions illustrated herein but are to include deviations in shapes that result, for example, from manufacturing.

FIG. 1A is a schematic diagram of a memory system 100a according to an embodiment of the present general inventive concept. Referring to FIG. 1A, the memory system 100 may include a printed circuit board 50, semiconductor packages 110a and 110b, a first switch 120, a controller 130, first signal lines 140a and 140b, a second signal line 150, and selection lines 160a and 160b.

The printed circuit board 50 may be a printed circuit board for use in a memory device. The memory device may include a solid state drive (SSD), a memory module, a memory card, a memory semiconductor package, or a combination thereof.

The semiconductor packages 110a and 110b may be mounted on the printed circuit board 50. The semiconductor packages 110a and 110b may include a plurality of memory chips, each of the memory chips having a memory cell array. The memory chips may include volatile memory chips, such as static random access memory (SRAM), dynamic RAM (DRAM), and synchronous dynamic RAM (SDRAM), and non-volatile memory chips, such as read-only memory (ROM), programmable ROM (PROM), erasable and programmable ROM (EPROM), electrically erasable and programmable ROM (EEPROM), flash memory, phase-change RAM (PRAM), magneto-resistive RAM (MRAM), resistive RAM (RRAM), and ferroelectric RAM (FRAM).

The first switch 120 may be mounted on the printed circuit board 50. The first switch 120 may sense an enable signal transmitted via the selection line 160a or 160b, and electrically connect the first line 140a or the second signal line 140b to the second signal line 150 corresponding to which of the selection line 160a or 160b transmitted the enable signal.

The first switch 120 may include an N-to-1 multiplexer that receives an enable signal from N selection lines, e.g., the selection line 160a or 160b when N is '2', and electrically connects one of N first signal lines, e.g., either the first signal lines 140a or 140b when N is '2', to the second signal line 150.

The controller package 130 may be mounted on the printed circuit board 50. The controller 130 may control an enable signal transmitted via the selection line 160a or 160b and a data signal transmitted via the first or second signal line 140a or 140b. In detail, the controller 130 may generate the enable signal and select the semiconductor package 110a or 110b. Also, the controller 130 may store a data signal in the semiconductor package 110a or 110b respectively and may load a data signal from the semiconductor package 110a or 110b via the first or second signal line 140a or 140b.

The controller 130 may include a control logic unit (not shown) in order to control the overall operations of the memory system 100. The control logic unit may include, for example, a read/write circuit that stores a data signal in the semiconductor package 110a or 110b or loads a data signal from the semiconductor package 110a or 110b, and an address decoder that decodes an address received from the outside and provides the decoded address to the read/write circuit.

N first signals may connect N semiconductor packages to the first switch in an N-to 1 correspondence. For example, when N is '2', the first signal lines 140a and 140b may connect to the first switch 120 in a 2-to-1 correspondence. The first signal lines 140a and 140b may deliver a data signal to be stored in the semiconductor package 110a or 110b or to be loaded from the semiconductor package 110a or 110b.

The second signal line 150 may be connected between the first switch 120 and the controller 130. The second signal line 150 and the first signal lines 140a or 140b may be electrically connected via the first switch 120. The second signal line 150 may deliver a data signal transmitted via the first signal line 140a or 140b to the controller 130 and vice versa.

N selection lines may connect N semiconductor packages to the first switch 120 in an N-to-1 correspondence. For example, when N is '2', the selection lines 160a ad 160b may connect two semiconductor packages 110a and 110b to the first switch 120, so that two semiconductor packages 110a and 110b and the first switch 120 are in a 2-to-1 correspondence. The N selection lines may connect N semiconductor packages to the controller 130 in an N-to-1 correspondence. For example, when N is '2', the selection lines 160a ad 160b may connect two semiconductor packages 110a and 110b to the controller 130, so that two semiconductor packages 110a and 110b and the controller 130 are in a 2-to-1 correspondence. The selection lines 160a and 160b may transmit a plurality of enable signals generated by the controller 130 to the semiconductor package 110a and 110b, respectively.

For example, if N selection lines, e.g., the selection lines 160a and 160b when N is '2', are respectively connected to N semiconductor packages, e.g., the semiconductor packages 110a and 110b when N is '2', then an enable signal transmitted via the selection line 160a, which is located leftmost among the selection lines 160a and 160b, may go low. In this case, the first switch 120 may sense the enable signal transmitted via the selection line 160a and electrically connect the first signal line 140a, which is located leftmost among the first signal lines 140a and 140b, to the second signal line 150. Thus, a data signal may be stored in or be loaded from the semiconductor package 110a, which is located leftmost among the semiconductor packages 110a and 110b.

Likewise, if N selection lines, e.g., the selection lines 160a and 160b when N is '2', are respectively connected to N semiconductor packages, e.g., the semiconductor packages 110a and 110b when N is '2', then an enable signal transmitted via the selection line 160b, which is located in rightmost among the selection lines 160a and 160b, may go low. In this case, the first switch 120 may receive the enable signal transmitted via the selection line 160b and electrically connect the first signal line 140b, which is located rightmost among the first signal lines 140a and 140b, to the second signal line 150. Thus, a data signal may be stored in or be loaded from the semiconductor package 110b, which is located rightmost among the semiconductor packages 110a and 110b.

When the first signal lines 140a and 140b are connected directly to the second signal line 150 without the first switch 120, the semiconductor packages 110a and 110b should be considered to determine equivalent resistances of all components connected to the controller 130. Also, the semiconductor packages 110a and 110b should be considered to determine equivalent resistances of all components connected to each of the semiconductor packages 110a and 110b.

However, in the current embodiment, the first switch 120 can select either the semiconductor package 110a or the semiconductor package 110b, in response to an enable signal. Thus, either the semiconductor package 110a or 110b can be considered to determine equivalent resistances of all components connected to the controller 130. Also, either the semiconductor package 110a or 110b can be considered to determine equivalent resistances of all components connected to each of the semiconductor packages 110a and 110b.

Thus, even if the total number of semiconductor packages is increased, a loading effect may be prevented from occurring. Accordingly, it is possible to prevent signal integrity from being degraded due to the loading effect.

The memory system 100a may further include a plurality of bi-directional buffers 170. N bi-directional buffers 170 may connect the first signal lines 140a and 140b to the first switch 120 in an N-to-1 correspondence, e.g., in a 2-to-1 correspondence when N is '2'. Each of the bi-directional buffers 170 may include a first repeater 180a having an input terminal connected to the first switch 120 and an output terminal connected to the first signal lines 140a an 140b, and a second repeater 180b having an input terminal connected to the first signal lines 140a an 140b and an output terminal connected to the first switch 120. When a data signal that is to be transmitted to the first and second signal lines 140a, 140b, and 150 attenuates, the first and second repeaters 180a and 180b may reproduce and transmit the data signal.

The switch 120 may include first I/O terminals 120a, 120b to connect to the bi-directional buffers 170 and an a second I/O terminal 120c to connect to the controller package 130.

Figure 1B:
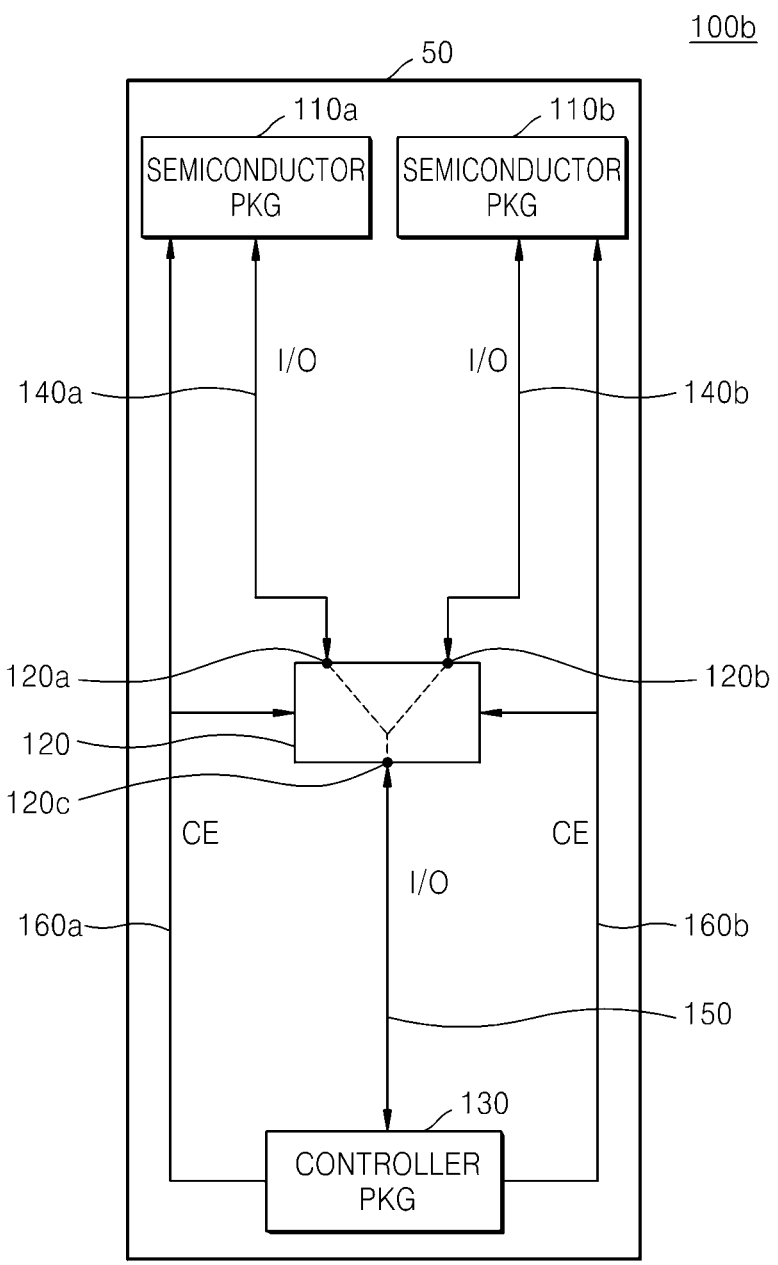

FIG. 1B illustrates a memory system 100b similar to the memory system 100a of FIG. 1A, but without the bi-directional buffers 170.

Figure 1C:
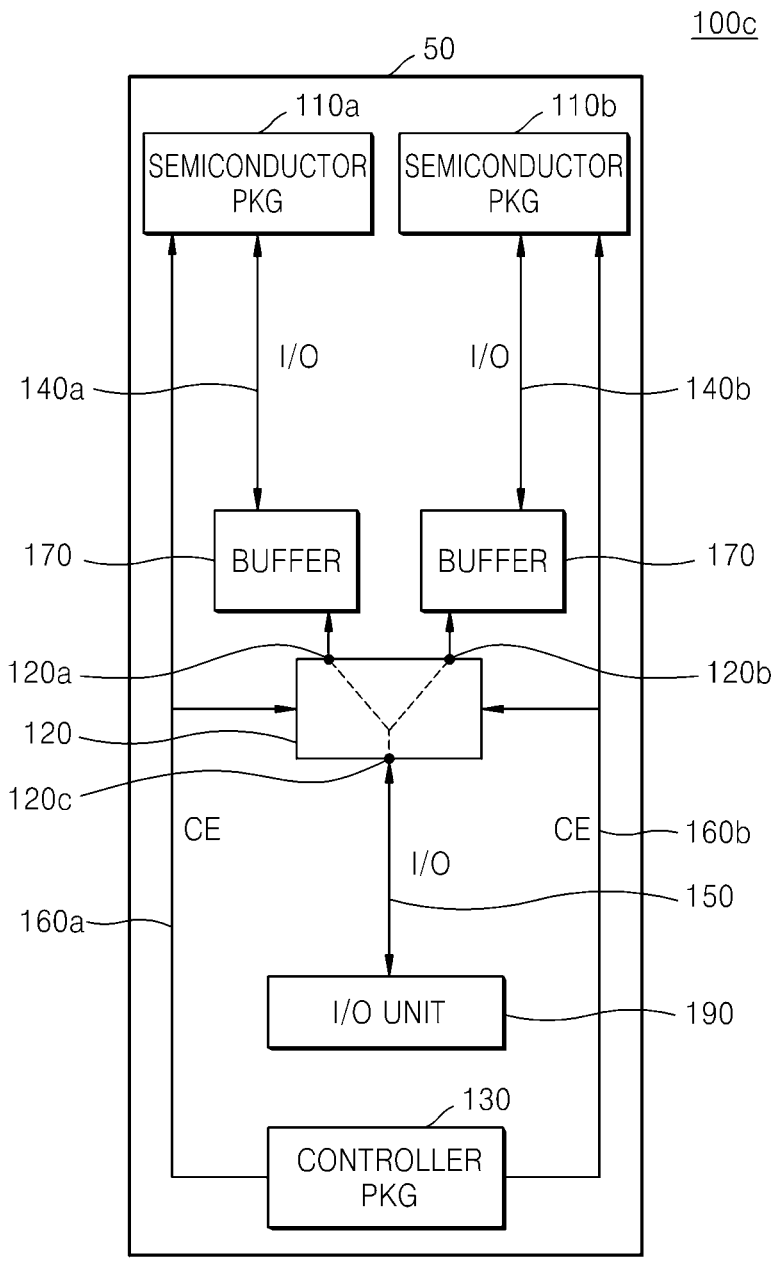

FIG. 1C illustrates a memory system 100c according to another embodiment of the present general inventive concept. The memory system 100c includes the semiconductor memory packages 110a and 110b, switch 120, and controller 130 illustrated in FIG. 1A. However, in FIG. 1C, the signal line 150, or I/O line, is connected to an I/O unit 190 that is separate from the controller package 130. The I/O unit 190 may be an I/O terminal, I/O buffer, memory, logic, or other circuitry to transmit data to and from the semiconductor packages 110a, 110b via the switch 120.

FIG. 1C illustrates a memory system 100c in which the controller package 130 transmits a selection signal to the switch 120 on a selection signal line 161 that is different from the selection lines 160a, 160b. However, one or more of the selection lines 160a, 160b may be connected to the switch 120 to act as a selection signal for the switch 120.

Figure 1D:
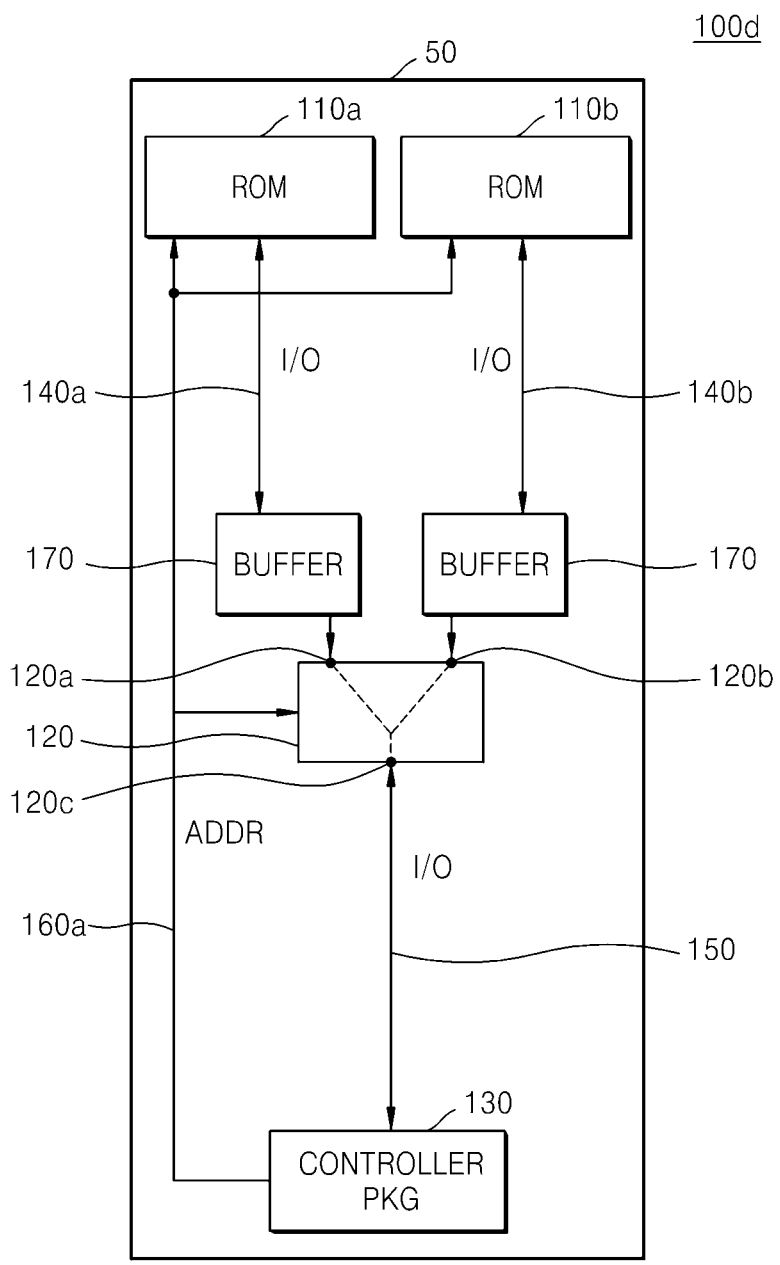

FIG. 1D illustrates a memory system 100d in which the controller package 130 transmits a selection signal 161 to the switch 120 and an address signal 160c, or a control signal, to the semiconductor packages 110a, 110b. Although only one address signal line 160c is illustrated in FIG. 1D, a separate address signal line 160c may be connected to each semiconductor package 110a, 110b if desired. In the embodiment illustrated in FIG. 1D, the semiconductor chips 110a, 110b may be read-only memory. The semiconductor chips 110a, 110b may be continuously enabled and outputting a signal to the switch 120 based on the address signal of the address signal line 160c from the controller package 130. The selection signal line 161 transmits a selection signal to select from which chip 110a, 110b the controller package 130 will receive data.

Figure 1E:
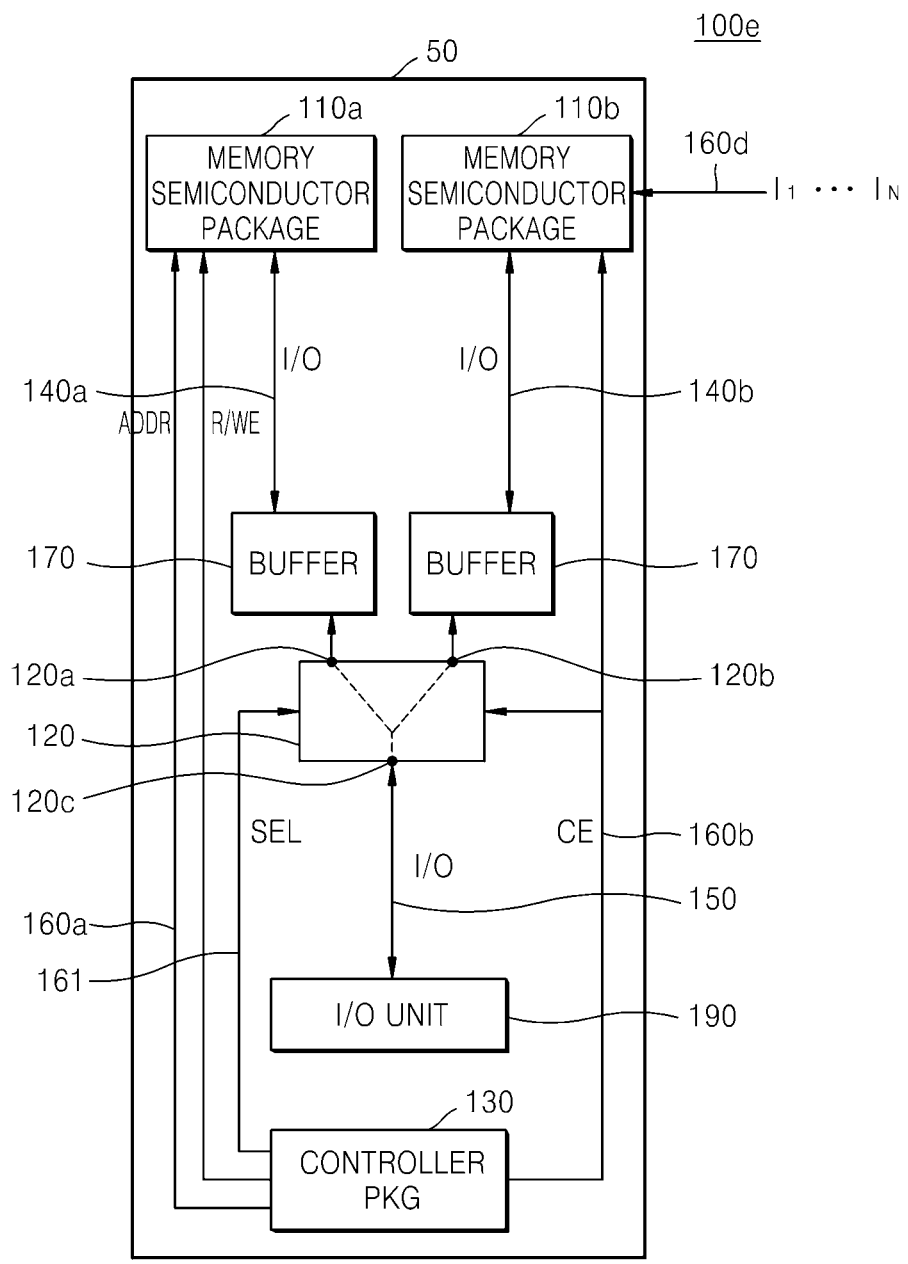

FIG. 1E illustrates a memory system 100e in which the controller package transmits an read/write enable signal R/WE to a memory semiconductor package 111 via a signal line 160e to indicate to the memory semiconductor package 111 whether the memory semiconductor package will output data to the signal line 140a in a read operation or receive data via the signal line 140a in a write operation. The controller package 130 may also transmit an address signal ADDR via an address line 160c to indicate a location on the memory semiconductor package 111 that is to be read from/written to.

A second semiconductor package 112 may include a logic circuit. The controller package 130 may output an enable signal EN to the logic semiconductor package 112 via the selection line 160b to indicate to the logic semiconductor package 112 whether the logic semiconductor package 112 is to receive data via the I/O signal line 140b or output data to the I/O signal line 140b. The logic semiconductor package 112 may receive inputs $I_1 \ldots I_n$ on which to perform logic functions from the controller package 130 or from external sources via one or more input lines 160d.

The controller package 130 may output a selection signal SEL to the switch 120 to indicate which semiconductor package 111, 112 will perform a read/write function with the controller package 130 via the signal lines 140a, 140b, and 150.

Although FIGS. 1A-1E illustrate various example embodiments of the present general inventive concept, any memory and/or logic circuit including a variety of data, address, enable, and selection inputs may be used. Data, address, and command inputs may be originated at the controller package 130, for an external source, or from any combination of the two. The semiconductor packages may be read-only, read/write, write-once, logic, or any other appropriate semiconductor package. The semiconductor packages may also be external to the printed circuit board 50, so that different semiconductor chips may be connected to the switch 120 via terminals. Likewise, any portion of the controller package 130 may be external to the printed circuit board 50 and connected to the switch 120 and semiconductor packages via terminals.

Figure 2:
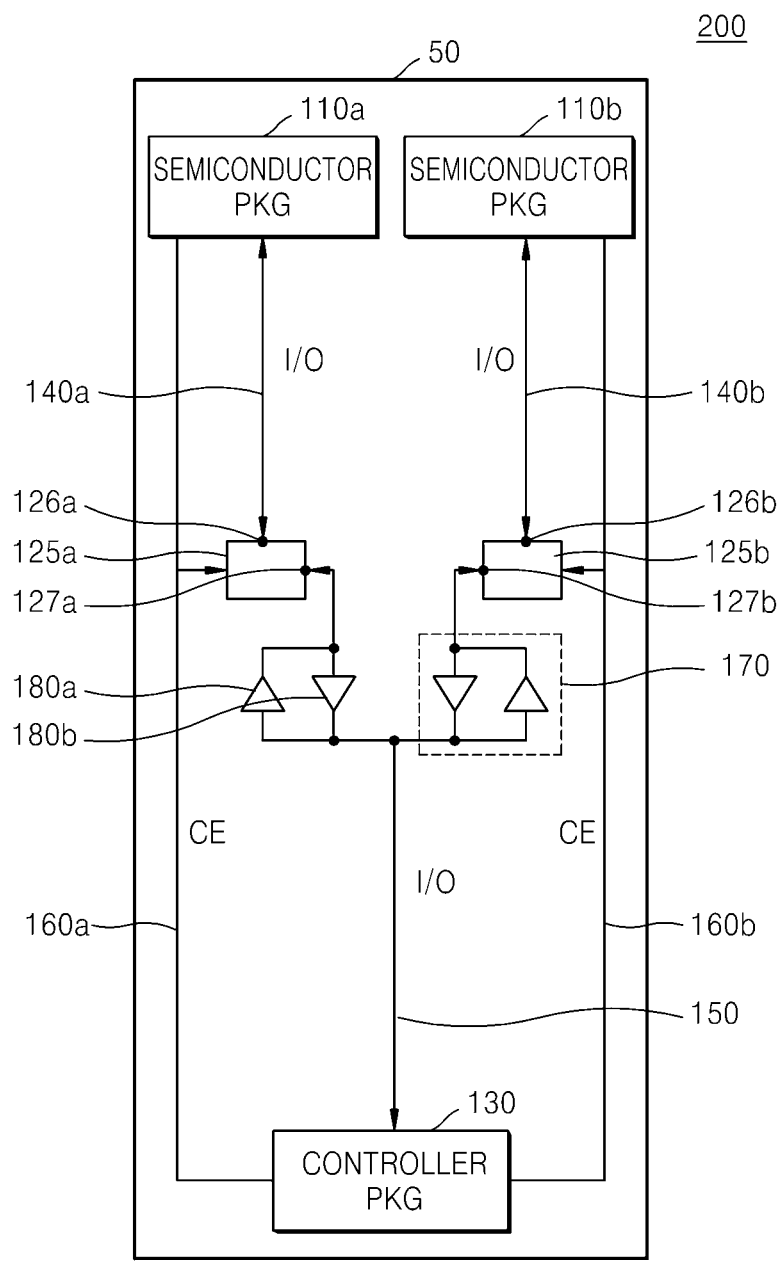
FIG. 2 is a schematic diagram of a memory system according to another embodiment of the present general inventive concept.

FIG. 2 is a schematic diagram of a memory system 200 according to another embodiment of the present general inventive concept. The memory system 200 may be a modified embodiment of the memory system 100 illustrated in FIG. 1. The operations and constructions of the elements of the memory system 200 that are the same as those of the elements of the memory system 100 will not be described again here.

Referring to FIG. 2, the memory system 200 may include second switches 125a and 125b. The second switches 125a and 125b may be mounted on a printed circuit board 50. The second switches 125a and 125b may sense enable signals from selection lines 160a and 160b and electrically connect first signal lines 140a and 140b to a second signal line 150, respectively.

N first signal lines may connect N semiconductor packages in a 1-to-1 correspondence. For example, when N is '2', the first signal lines 140a and 140b may connect the semiconductor packages 110a and 110b, respectively, so that the first signal lines 140a and 140b and the semiconductor packages 110a and 110b are in a 1-to-1 correspondence. The first signal lines 140a and 140b may transmit a data signal to be stored in or to be loaded from the semiconductor packages 110a and 110b.

The second signal line 150 may be connected to the second switches 125a and 125b to a controller 130, respectively. The second signal line 150 and the first signal lines 140a and 140b may be electrically connected via the second switches 125a and 125b, respectively. The second signal line 150 may transmit data signals from the first signal line 140a or the second signal line 140b to the controller 130 and vice versa.

N selection lines may connect N semiconductor packages to N second switches in a 1-to-1 correspondence. For example, when N is '2', the selection lines 160a and 160b may connect the semiconductor packages 110a and 110b to the second switches 125a and 125b, respectively, so that the semiconductor packages 110a and 110b and the second switches 125a and 125b are in a 1-to-1 correspondence. Also, the N selection lines may connect the N semiconductor packages to the controller 130 in an N-to-1 correspondence. For example, when N is '2', the selection lines 160a and 160b may connect two semiconductor packages 110a and 110b to the controller 130, so that two semiconductor packages 110a and 110b and the controller 130 are in a 2-to-1 correspondence. The selection lines 160a and 160b may deliver enable signals from the controller 130 to the semiconductor packages 110a and 110b, respectively.

For example, if N selection lines, e.g., the selection lines 160a and 160b when N is '2', are respectively connected to N semiconductor packages, e.g., the semiconductor packages 110a and 110b when N is '2', then an enable signal transmitted via the selection line 160a, which is located leftmost among the selection lines 160a and 160b, may go low. In this case, the second switch 125a, which is located leftmost among the second switches 125a and 125b may sense the enable signal transmitted via the selection line 160a, and may electrically connect the signal line 140a, which is located leftmost among the first signal lines 140a and 140b, to the second signal line 150. Thus, a data signal may be stored in or loaded from the semiconductor package 110a, which is located leftmost among the semiconductor packages 110a and 110b.

Similarly, if N semiconductor packages, e.g., the semiconductor packages 110a and 110b when N is '2', are respectively connected to N selection lines, e.g., the selection lines 160a and 160b when N is '2', then an enable signal transmitted via the selection line 160b, which is located rightmost among the selection lines 160a and 160b, may go low. In this case, the second switch 125b, which is located rightmost among the second switches 125a and 125b, may sense the enable signal transmitted via the selection line 160b and may electrically connect the signal line 140b, which is located rightmost among the first signal lines 140a and 140b, to the second signal line 150. Accordingly, a data signal may be stored in or be loaded from the semiconductor package 110b, which is located rightmost among the semiconductor packages 110a and 110b.

The memory system 200 may include a plurality of bi-directional buffers 170. N bi-directional buffers, e.g., the bi-directional buffers 170 when N is '2', may connect the second switches 125a and 125b to the second signal line 150 in an N-to-1 correspondence, e.g., in a 2-to-1 correspondence.

The plurality of switches 125a, 125b may have I/O terminals 126a, 126b connected to the signal lines 140a, 140b and I/O terminals 127a, 127b connected to the buffers 170.

Figure 3:
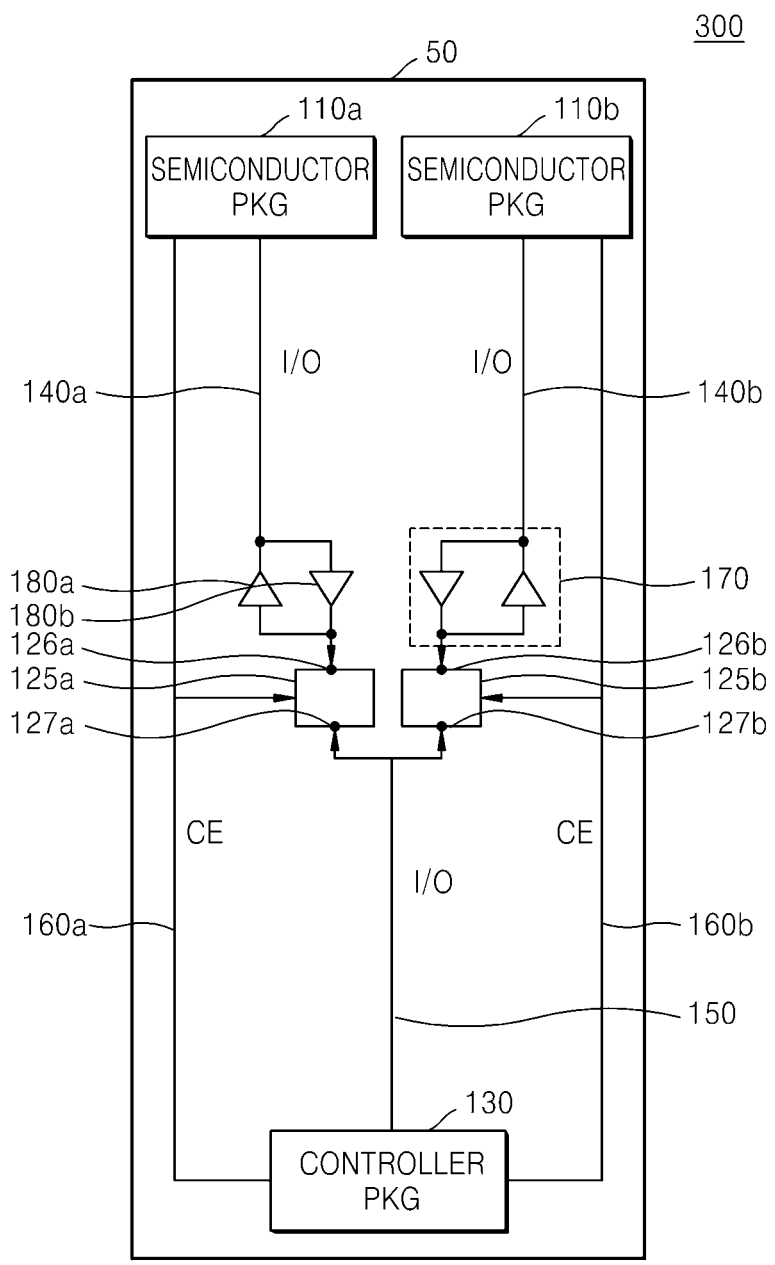
FIG. 3 is a schematic diagram of a memory system according to another embodiment of the present general inventive concept.

FIG. 3 is a schematic diagram of a memory system 300 according to another embodiment of the present general inventive concept. The memory system 300 may be a modified embodiment of the memory system 200 illustrated in FIG. 2. The operations and constructions of the elements of the memory system 300 that are the same as those of the elements of the memory system 200 will not be described again here.

The memory system 300 may further include a plurality of bi-directional buffers 170. N bi-directional buffers may connect N first signal lines to N second switches in a 1-to-1 correspondence. For example, when N is '2', two bi-directional buffers 170 may connect two first signal lines 140a and 140b to two second switches 125a and 125b, respectively, so that the first signal lines 140a and 140b and the second switches 125a and 125b are in a 1-to-1 correspondence.

The plurality of switches 125a, 125b may have I/O terminals 126a, 126b connected to the buffers 170 and I/O terminals 127a, 127b connected to the signal line 150.

While the above embodiments illustrated in FIGS. 1A-3 each have different elements, the present general inventive concept is not limited to the memory systems illustrated in these figures. Elements from any Figure may be combined with elements from another Figure. For example, a memory system having no buffer circuitry, as illustrated in FIG. 1B, may be combined with a memory system having a logic semiconductor package, as illustrated in FIG. 1E. Any other combination of circuitry may be used, depending on the design requirements of the circuit.

Figure 4:
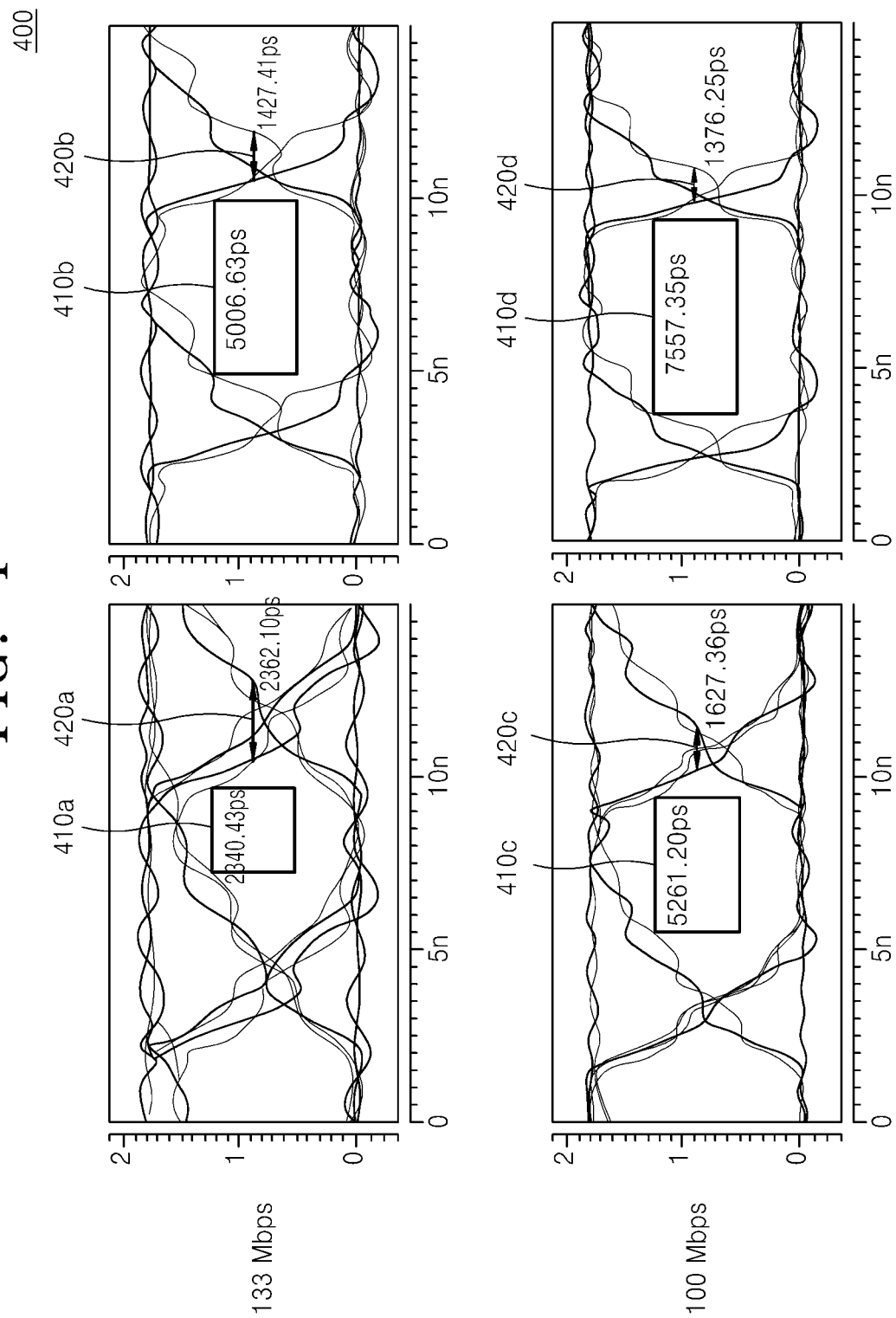
FIG. 4 is an eye diagram 400 comparing signals output from a conventional memory system in which first signal lines are connected directly to a second signal line without a first switch with signals that are input to or output from one of memory systems according to embodiments of the present general inventive concept.

FIG. 4 is an eye diagram 400 comparing signals that are input to or output from a conventional memory system in which first signal lines are connected directly to a second signal line without a first switch with signals that are input to or output from one of memory systems according to embodiments of the present general inventive concept.

Eye window sizes 410a, 410b, 410c, and 410d, each representing the degree of signal interference caused by distortion of a transmission path, may be compared to estimate channel performance. The eye window size 410a of the conventional memory system is 2.34 ns at 133 Mbps, whereas the eye window size 410b of one of the memory systems according to the embodiments of the present general inventive concept is 5.01 ns at 133 Mbps. Thus, the eye window size 410b of one of the memory systems according to the embodiments of the present general inventive concept is increased by about 114 percent compared to the eye window size 410a of the conventional memory system.

The eye window size 410c of the conventional memory system is 5.26 ns at 100 Mbps, whereas the eye window size 410d of one of the memory systems according to the embodiments of the present general inventive concept is 7.56 ns at 100 Mbps. Thus, the eye window size 410d of the memory systems according to the embodiments of the present general inventive concept is increased by about 44 percent compared to the eye window size 410c of the conventional memory system.

Jitter represents change in the cycle of a signal frequency from a target timing location and may be considered in order to estimate a deviation or variation in phases of waves in a high-frequency domain. A jitter 420a generated in the conventional memory system is 2.36 ns at 133 Mbps, whereas a jitter 420b generated in one of the memory systems according to embodiments of the present general inventive concept is 1.43 ns at 133 Mbps. Thus, the jitter 420b in one of the memory systems according to the embodiments of the present general inventive concept is reduced by about 39 percent compared to the jitter 420a in the conventional memory system.

A jitter 420c generated in the conventional memory system is 1.63 ns at 100 Mbps, whereas a jitter 420d generated in one of the memory systems according to embodiments of the present general inventive concept is 1.38 ns at 100 Mbps. Thus, the jitter 420d in the memory systems according to the embodiments of the present general inventive concept is reduced by about 15 percent compared to the jitter 420c in the conventional memory system.

Accordingly, in the memory systems according to the embodiments of the present general inventive concept, the total number of memory chips that can be connected to a controller may be increased without degrading signal integrity (SI) characteristics. That is, the memory systems according to the embodiments of the present general inventive concept may have greater storage capacity than those of conventional memory systems, the operating speeds of which are equal to those of the memory systems according to the embodiments of the present general inventive concept.

Figure 5:
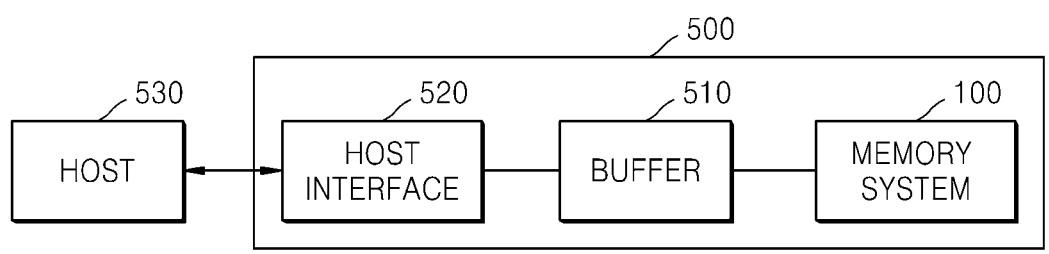
FIGS. 5 and 6 are, respectively, a block diagram of and a plane view of a memory device having a memory system according to an embodiment of the present general inventive concept.
Figure 6:
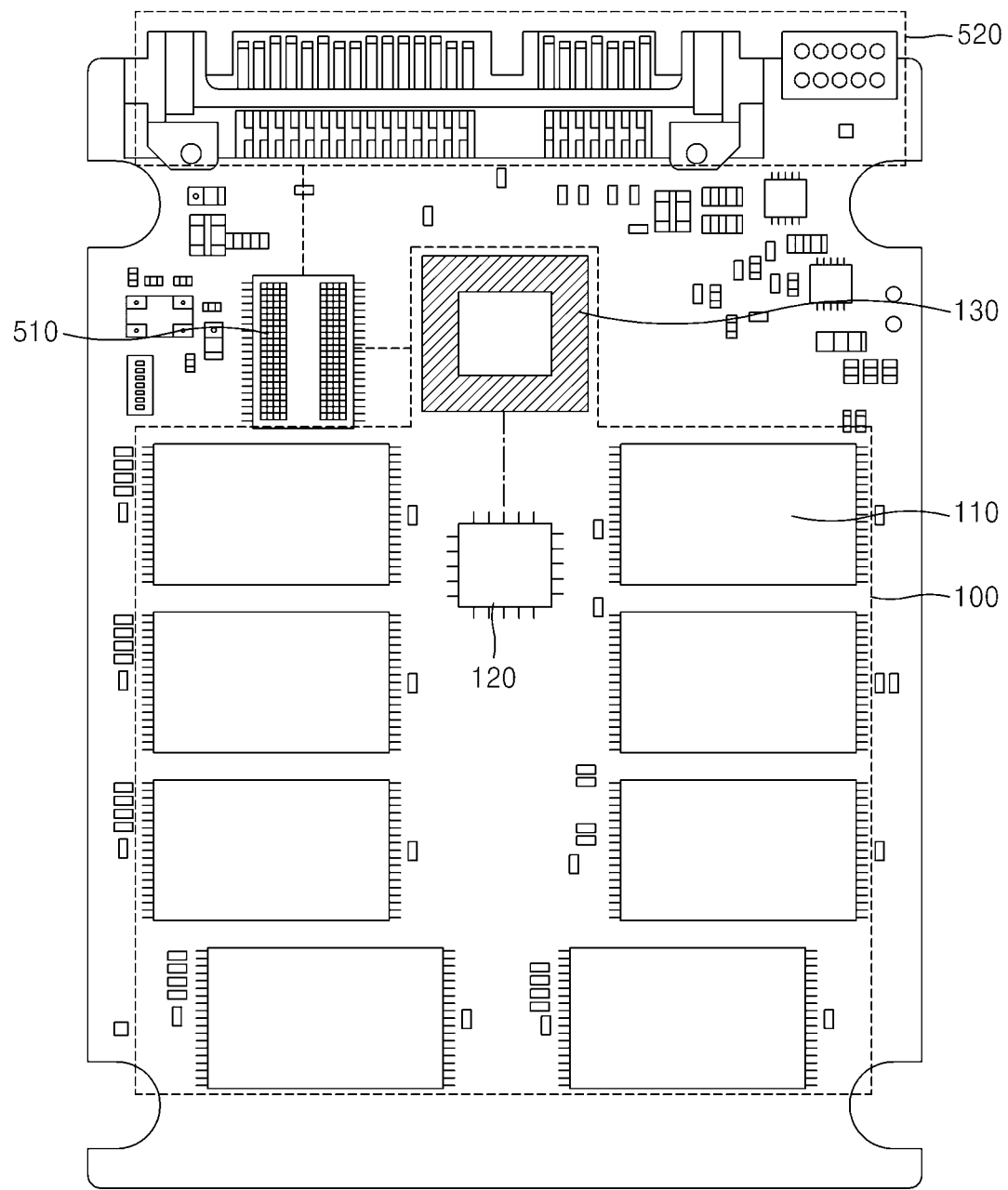

FIGS. 5 and 6 are, respectively, a block diagram of and a plane view of a memory device 500 having a memory system 100 according to embodiments of the present general inventive concept. Referring to FIGS. 5 and 6, the memory device 500 may include the memory system 100, a buffer 510, and a host interface 520. The memory system may include the controller 130, the memory packages 110, and the first switch 120 or the second switches 125a and 125b as described above.

The memory device 500 may include an SSD, a memory module, a memory card, a memory semiconductor package, or a combination thereof. In particular, the memory card may be a personal computer memory card international association (PCMCIA) card, a compact flash (CF) card, a smart media card (SM/MMC), a memory stick, a multimedia card (MMC, RS (reduced-size)-MMC, or MMCmicro), an SD card (SD, mini SD, or micro SD), a universal flash storage (UFS) device, or a combination thereof.

The host interface 520 communicates with the host 530. That is, the host interface 520 may receive data to be written to the memory system 100 from the host 530 or may transmit data loaded from the memory system 100 to the host 530. The host interface 520 may include protocols to exchange data between the host 530 and the memory system 100. The protocols may include, for example, a universal serial bus (USB), a multimedia card (MMC), a peripheral component interconnect express (PCI-E), advanced technology attachment (ATA), serial-ATA, parallel-ATA, a small computer systems interface (SCSI), an enhanced small disk interface (ESDI), and integrated drive electronics (IDE).

The buffer 510 is connected between the memory system 100 and the host interface 520. The buffer 510 may temporarily store data to be written to or to be loaded from the memory system 100.

In the memory device 500 or the memory system 100, various types of memory packages may be mounted on the printed circuit board 50 of FIG. 1, 2, or 3. The various types of memory packages include a package on package (POP), a ball grid array (BGA), a chip scale package (CSP), a plastic leaded chip carrier (PLCC), a plastic dual in-line package (PDIP), a chip on board (COB), a ceramic dual in-line package (CERDIP), a metric quad flat package (MQFP), a thin quad flat package (TQFP), a system in package (SIP), a multi chip package (MCP), a wafer-level fabricated package (WFP), a wafer-level processed stack package (WSP), and so on.

Figure 7:
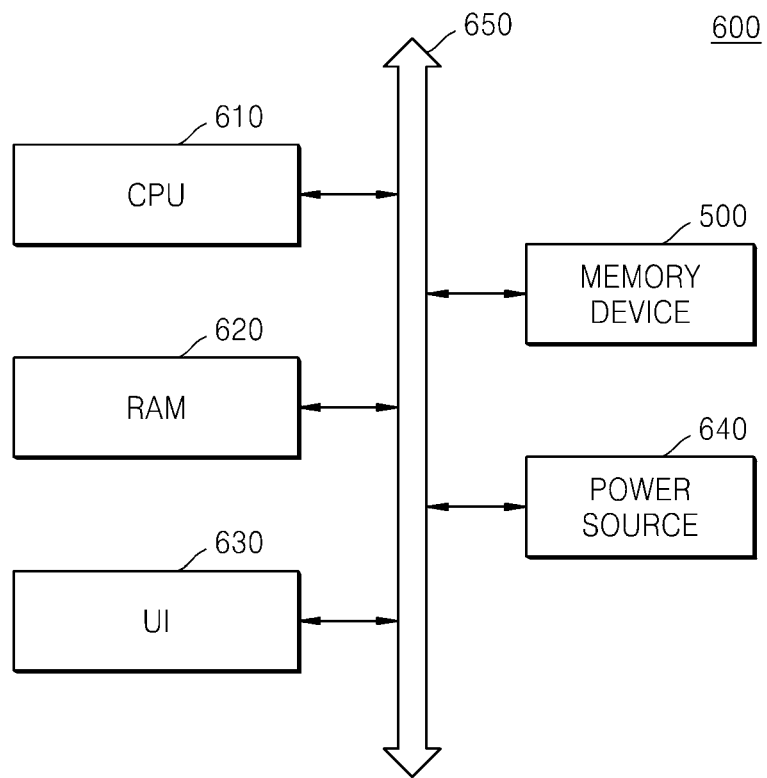
FIG. 7 is a block diagram of a computing system having the memory device of FIG. 5, according to an embodiment of the present general inventive concept.

FIG. 7 is a block diagram of a computing system 600 having the memory device 500 of FIG. 5, according to an embodiment of the present general inventive concept. Referring to FIG. 7, the computing system 600 may include a central process unit (CPU) 610, a random access memory (RAM) 620, a user interface (UI) 630, a power source 640, and the memory device 500.

The memory device 500 is electrically connected to the CPU 610, the RAM 620, the UI 630, and the power source 640 via a system bus 650. Data that is provided via the UI 630 or that is processed by the CPU 610 is stored in the memory device 500. The memory device 500 may be embodied as an SSD, and in this case, the booting speed of the computing system 600 may increase greatly. Although not shown in the drawings, the computing system 600 may further include an application chipset, a camera image processor, etc.

Figure 8:
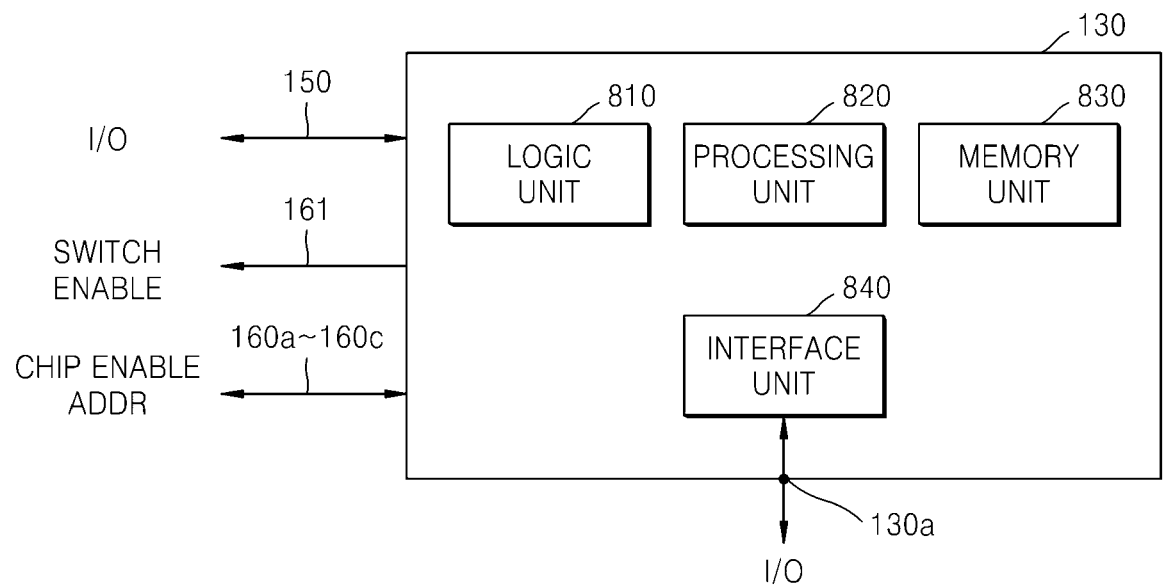
FIG. 8 is a block diagram of a controller package according to an embodiment of the present general inventive concept.

FIG. 8 illustrates an example of a controller package 130 according to an embodiment of the present general inventive concept. The controller package 130 may include a logic unit 810, a processing unit 820, a memory unit 830, an interface unit 840, or any combination of these units. The logic unit 810 may include a programmable logic unit, such as an field programmable gate array, or non-programmable logic. The logic unit 810 may output data to or receive data from I/O lines 150 or may be configured to control an enable line 161 or a read/write command line (not shown). The logic unit 810 may also be configured to transmit data to and from any one of the processing unit 820, memory unit 830, and interface unit 840.

The processing unit 820 may control operation of the logic unit 810, memory unit 830, and interface unit 840. The processing unit 820 may also transmit and receive data via the I/O lines 150 or transmit data via the switch enable line 161 and the chip enable and address lines 160a-160c. The processing unit 820 may receive data from any one of the logic unit 810, interface unit 840, memory unit 830, and I/O lines 150 to process and transmit to any other of these units or lines.

The memory unit 830 may comprise read-only memory, flash memory, cache memory, or any other appropriate type of memory. The memory unit 830 may be configured to output data to or receive data from any one of the I/O lines 150, logic unit 810, processing unit 820, and interface unit 840. The memory unit 830 may store instructions, addresses, operation code, or any other data.

The interface unit 840 may comprise an I/O terminal such as a pin, port, wire, antenna, or any other means to interface with another device via a wire or wirelessly, including via RF waves, IR waves, or any other wireless method. The interface unit 840 may include memory or logic, or may use the memory unit 830 and logic 810 of the controller package 130.

The controller package 130 may be an IC formed of a single chip, mounted on a same circuit board, or may include chips and electrical components on various circuit boards or in various devices that are connected to form a controller package 130. For example, a processing unit 820 may be mounted on a same printed circuit board 50 as a switch 120, but a memory unit 830 accessed by the processing unit 820 may be electrically connected to the processing unit 820 via a terminal.

As discussed above, the controller 130 may include a control logic unit to control the overall operations of the memory system 100. The control logic unit may include, for example, a read/write circuit that stores a data signal in the semiconductor package 110a or 110b or loads a data signal from the semiconductor package 110*a* or 110*b*, and an address decoder that decodes an address received from the outside and provides the decoded address to the read/write circuit. The control logic unit may be the processing unit 820, the logic unit 810, or any combination of parts or functions of the units 810, 820, 830, and 840 of the controller 130.

While the present general inventive concept has been particularly shown and described with reference to exemplary embodiments thereof, it will be understood that various changes in form and details may be made therein without departing from the spirit and scope of the following claims.

What is claimed is:

1. A semiconductor device, comprising:
   at least two semiconductor chips;
   a switch connected to each of the semiconductor chips via at least two first I/O lines, each first I/O line connected to a separate semiconductor chip; and
   a controller connected to the switch via a single second I/O line and to each of the switch and the at least two semiconductor chips via an enable line,
   wherein the controller controls the switch to transmit data between only one of the first I/O lines and the second I/O line.

2. The semiconductor device according to claim 1, wherein the at least two semiconductor chips comprise memory semiconductor chips.

3. The semiconductor device according to claim 1, wherein at least one of the semiconductor chips comprises a logic semiconductor chip.

4. The semiconductor device according to claim 1, wherein the switch comprises at least two switches, each switch connected to a single semiconductor chip and each semiconductor chip connected to only one switch,
   the enable line comprises at least two enable lines, and
   each semiconductor chip and corresponding switch is connected to a same enable line that is separate from an enable line connected to any other semiconductor chip.

5. The semiconductor device according to claim 1, wherein the switch comprises only one chip.

6. The semiconductor device according to claim 1, further comprising:
   bi-directional buffers connected between the semiconductor chips and the switch.

7. The semiconductor device according to claim 1, further comprising:
   bi-directional buffers connected between the switch and the controller chip.

8. A semiconductor device, comprising:
   at least two semiconductor chips;
   a switch connected to each of the semiconductor chips via at least two first I/O lines, each first I/O line connected to a separate semiconductor chip of the two semiconductor chips; and
   a controller connected to the switch via an enable line and a second I/O line, and to the at least two semiconductor chips via at least one control line,
   wherein the controller controls the switch via the enable line to transmit data between only one of the first I/O lines and the second I/O line.

9. The semiconductor device according to claim 8, wherein the control line comprises at least one of a read/write control line, an address line, and a chip enable line.

10. The semiconductor device according to claim 8, wherein at least one of the semiconductor chips comprises a logic circuit including at least one terminal to receive a data input from a device external to the semiconductor device.

11. The semiconductor device according to claim 8, wherein the second I/O line is connected to at least one of a logic circuit, a memory chip, a processor, and an I/O port.

12. A semiconductor device, comprising:
    at least two semiconductor chips;
    a switch connected to each of the semiconductor chips via at least two first I/O lines, each first I/O line connected to a separate semiconductor chip; and
    wherein the switch is connected to a single second I/O line, and the switch is configured to be controlled to transmit data between only one of the first I/O lines and the second I/O line.

13. The semiconductor device according to claim 12, wherein the switch is implemented in a chip.

14. The semiconductor device according to claim 13, further comprising:
    a printed circuit board mounting the at least two semiconductor chips and the chip.

15. The semiconductor device according to claim 12, further comprising:
    bi-directional buffers connected between the semiconductor chips and the switch, and
    wherein the switch and the bi-directional buffers are implemented in a chip.

16. The semiconductor device according to claim 15, further comprising:
    a printed circuit board mounting the at least two semiconductor chips and the chip.

17. The semiconductor device according to claim 12, further comprising:
    a controller connected to the switch via the single second I/O line and to each of the switch and the at least two semiconductor chips via a line,
    wherein the controller controls the switch to transmit data between only one of the first I/O lines and the second I/O line.

18. A multi-chip package, comprising:
    at least two semiconductor chips;
    a switch connected to each of the semiconductor chips via at least two first I/O lines, each first I/O line connected to a separate semiconductor chip; and
    wherein the switch is connected to a single second I/O line, and the switch is configured to be controlled to transmit data between only one of the first I/O lines and the second I/O line.

* * * * *